United States Patent [19]
Säufferer et al.
[11] 4,021,645
[45] May 3, 1977

[54] METHOD AND APPARATUS FOR DETERMINING WHETHER AN ELECTRONIC TAXIMETER IS IN PROPER WORKING ORDER

[75] Inventors: Manfred Säufferer, Villingen-Schwenningen; Siegfried Spauszus, Unterkirch; Ulrich Warkentin, Tannheim, all of Germany

[73] Assignee: Kienzle Apparate GmbH, Villingen, Germany

[22] Filed: July 11, 1975

[21] Appl. No.: 594,462

[30] Foreign Application Priority Data

July 13, 1974 Germany .......................... 2433753

[52] U.S. Cl. .......................... 235/92 TC; 235/30 R; 235/92 DE; 235/92 R

[51] Int. Cl.$^2$ .................. H03K 21/30; G07B 13/00

[58] Field of Search ..... 235/92 TC, 92 DE, 92 EA, 235/30 R, 30 A; 73/1 R

[56] References Cited

UNITED STATES PATENTS

| | | | |
|---|---|---|---|
| 3,426,273 | 2/1969 | Kuntz et al. | 73/1 R |
| 3,746,843 | 7/1973 | Wesner | 235/92 EA |
| 3,860,806 | 1/1975 | Fichter et al. | 235/30 R |

*Primary Examiner*—Joseph M. Thesz
*Attorney, Agent, or Firm*—Michael J. Striker

[57] ABSTRACT

A testing switch is activated manually by the taxi driver or automatically at the end of a trip. When the testing switch is activated, a preselected plurality of pulses is applied to the computing means of the electronic taximeter. If the taximeter is in proper working order, the indicating means of the taximeter will successively and in unison display the numerals from 0 to 9 at the rate or about one per second. If the numerals do not appear in the proper sequence, or if the driver perceives that they appear at a rate markedly different from one per second, or if some or all do not appear whatsoever, he knows that the electronic taximeter is not in proper working order.

8 Claims, 1 Drawing Figure

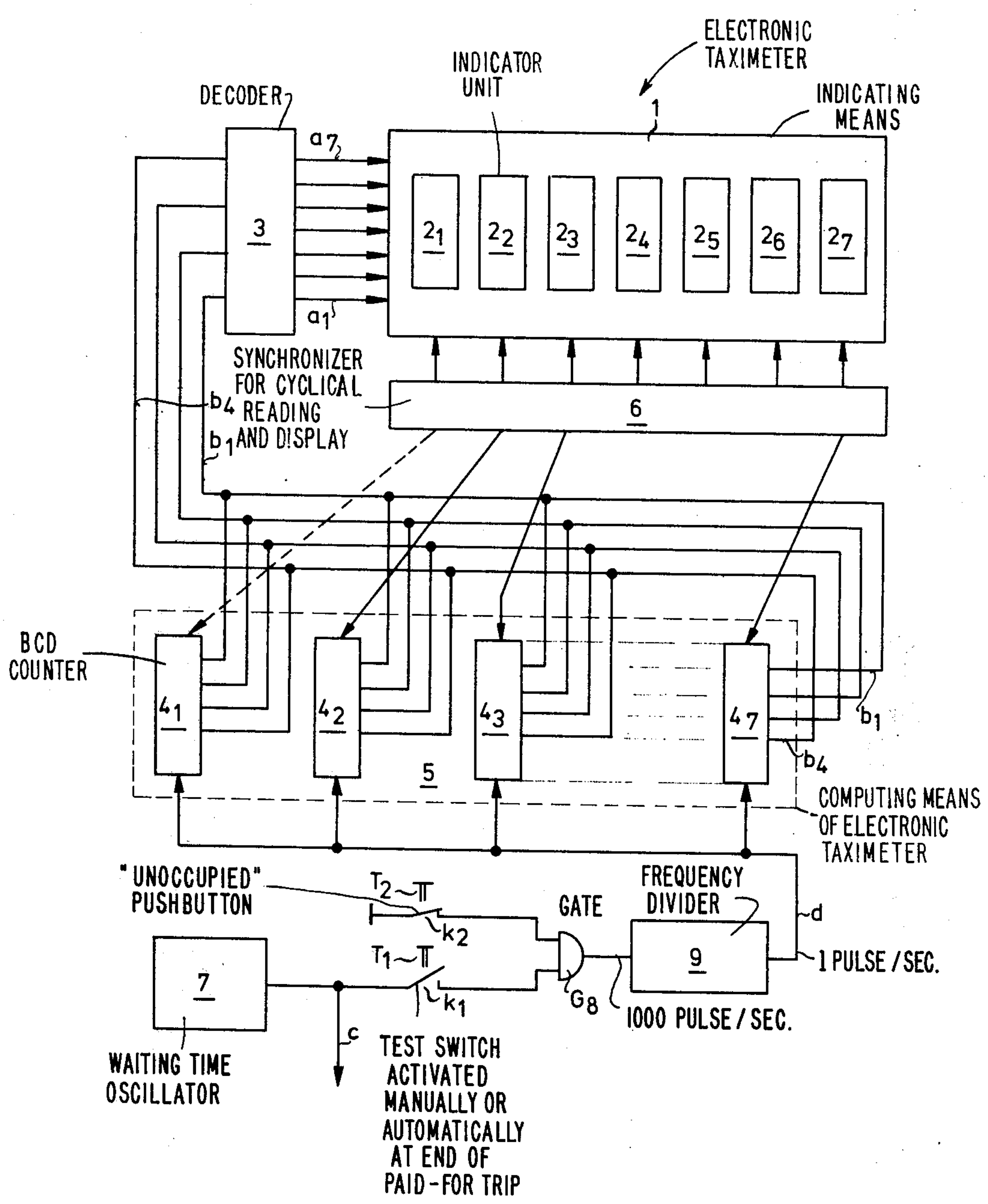
ELECTRONIC TAXIMETER
INDICATOR UNIT
DECODER
INDICATING MEANS
1
3
a7
a1
21
22
23
24
25
26
27
SYNCHRONIZER FOR CYCLICAL READING AND DISPLAY
b4
b1
6
BCD COUNTER
41
42
43
47
5
COMPUTING MEANS OF ELECTRONIC TAXIMETER
"UNOCCUPIED" PUSHBUTTON
T2
k2
T1
k1
GATE
G8
FREQUENCY DIVIDER
9
d
1 PULSE / SEC.
1000 PULSE / SEC.
7
WAITING TIME OSCILLATOR
c
TEST SWITCH ACTIVATED MANUALLY OR AUTOMATICALLY AT END OF PAID-FOR TRIP

METHOD AND APPARATUS FOR DETERMINING WHETHER AN ELECTRONIC TAXIMETER IS IN PROPER WORKING ORDER

BACKGROUND OF THE INVENTION

The invention relates to determining whether an electronic taximeter is in proper working order.

With conventional mechanical or electromechanical taximeters, it was not in general necessary to regularly test the taximeter to determine whether it was in proper working order. Any malfunctions in the interior of the device, on account of the mechanical transmissions between the input-speed rotary members and the fare indicating device, would become immediately apparent, because the indicating arrangement would simply cease to operate. However, with electronic taximeters the situation is quite different. With electronic taximeters, a very considerable period of time may pass before a malfunction of the electronic computing and indicating circuitry is perceived. This is because such electronic circuit malfunctions only seldom result in a stopping or perceivable inaccuracy in the progress of the counting action displayed by the taximeter indicating means.

With electronic computers, it is known to provide a built-in check of accuracy by using redundant electronic computer circuitry and performing all computations redundantly and in parallel. The results of the parallel, redundant computations are compared, and only if they are identical is there a readout of the results; otherwise a malfunction-indicating signal or the like is generated. A clear and very significant disadvantage of using this double-check expedient in an electronic taximeter is the expense of the redundant circuitry.

Another well-known error-detecting technique employed with electronic computer apparatuses is the use of a parity check. For example, if the computer handles 7-bit binary numbers, then there is added to each numberan eighth or parity bit, which will be a 0 or a 1, depending upon the number of 0 and 1 bits in the 7-bit number. For example, the eighth or parity bit will be so selected that the total number of 0 bits in each such 8-bit number will be even. Special parity-checking auxiliary computer circuits are known for detecting errors by detecting loss or changes of parity in the binary-coded signals at various stages of the processing of the signals by the computer. The use of a parity check for error-detecting purposes in an electronic taximeter is at the present time prohibitively expensive, because of the considerable amount of additional circuitry required to effect the parity check.

SUMMARY OF THE INVENTION

The general object of the present invention is to be able to determine with great reliability whether an electronic taximeter is in proper working order by resort to a method and apparatus of an extremely simple and inexpensive nature.

This object, and others which will become more understandable from the description, below, of preferred embodiments, can be met, according to one advantageous concept of the invention, by applying to the computing means of the electronic taximeter a plurality of test signals so preselected that, if the taximeter is in proper working order, the indicating means of the taximeter will provide a predetermined indication.

Advantageously, the test signals can be applied to the computing means of the electronic taximeter either in response to manual activation of a button on the taximeter and/or automatically in response to termination of a paid-for taxi trip.

According to an advantageous concept of the invention, the test signals are derived from the pulse train supplied by the waiting-time oscillator anyway present in an electronic taximeter, but preferably after the pulse train of the waiting-time oscillator has been passed through a frequency divider to lower its frequency. Preferably, the taximeter is of the type wherein the rate at which the indicator units of the indicating means of the taximeter provide their respective indications in response to the test signals corresponds to the frequency-divided rate of the waiting-time oscillator pulse train.

In general, taximeters are provided with some type of clock signal generator, such as an oscillator in the case of an electronic taximeter or a clockwork mechanism in the case of a mechanical taximeter, for the purpose of determining that component of the fare which is computed on a pure-time basis, for example simple waiting time, or pure-time-computations which are automatically initiated when the taxi travels below a certain minimum speed, for example in slow traffic. For reasons relating to the accuracy of the fare computation, the clock signal generator must generate a relatively high-frequency output signal. By way of example, the waiting-time oscillator of an electronic taximeter may generate a pulse train having a pulse-repetition frequency of 1000 pulses/sec. For the actual waiting-time computation, this high-frequency pulse train is frequency-divided down to an appropriate signal-processing frequency.

If, in order to determine whether the electronic taximeter is in proper working order, use is made of the pulse train generated by the waiting-time oscillator, then it is appropriate to divide the pulse-repetition frequency of the pulse train of the waiting-time oscillator by 1000, 1500, or the like. In this way, for each 1000 or 1500 pulses generated by the waiting-time oscillator, one test pulse will be applied to the computing means of the electronic taximeter. As the preferred possibility, these test pulses are applied to the computing means in such a way as to cause each of the indicator units of the digital indicating (readout) means of the taximeter to run the range from 0 to 9, 1 to 0, or whatever.

Instead of using for the test signals pulses derived from those generated by the waiting-time oscillator anyway present in most electronic taximeters, it would alternatively be possible to use a separate special-purpose oscillator or clock signal generator to produce a pulse train having a frequency appropriate for the design of the computing circuitry of the particular taximeter.

Incidentally, it should be mentioned that such a determination of whether the electronic taximeter is in proper working order should in general be performed only when th taximeter is in the FREE or UNOCCUPIED setting — i.e., after the computing circuitry of the taximeter has been reset to zero. With the taximeter in the FREE setting, if the test button on the meter is pressed, then, according to the most preferred mode of operation, the pulse train of the clock signal generator is frequency-divided by 1000 or 1500, applied to the computing circuitry of the taximeter, and with a clock-signal frequency of one per second or 1.5 per second counted up by the latter from 0 to 1 to 2, etc. up to 9.

Instead of initiating the test operation by means of a manual pushbutton, or the like, it is also possible to perform the test operation each time the taximeter is switched into the FREE setting. This can be made to occur automatically by per se conventional hardware or by an appropriate addition to the microprogram of the computing circuitry of the taximeter, assuming the taximeter has the capacity to accommodate such an addition to its microprogram. Here likewise, it is preferred that the indicating means of the taximeter be activated to display the contents of the computing circuitry of the taximeter with a display rate of one digit per second or per 1.5 seconds. In that way, within ten or fifteen seconds after the automatic or manual activation of the test switch, the indicating means will run through the complete display cycle of 0000000, 1111111, 2222222, etc., up to 9999999, assuming by way of example that the indicating means comprises seven similar indicating units.

In this way it is possible to determine that the computing means, the indicating means and also the waiting-time oscillator, if used for the test operation, are all in proper working order. If one or more of these components is not functioning properly, then the aforementioned display cycle will be performed incorrectly, irregularly, incompletely, at a perceptibly incorrect speed, or not at all. In any event, this will be perceived quite readily the the taxi driver or inspector.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

The single FIGURE depicts very schematically a portion of an electronic taximeter and the manner in which it is connected to the testing means.

DESCRIPTION OF THE PREFERRED EMBODIMENTS

In the FIGURE only that much of an exemplary electronic taximeter is depicted as is necessary to understand the inventive concept and apparatus.

Reference numeral 1 denotes the indicating means of the electronic taximeter. The indicating means 1 is provided with seven indicator units $2_1$ to $2_7$. These indicator units can for example be conventional 7-element illuminated-digit indicator units of the type which display an 8 when all seven elements of the indicator unit are illuminated. Signals indicative of what digits are to be indicated by the indicator units 2 are applied to the indicating means 1 via input lines $a_1$ to $a_7$. Each of these seven input lines is associated with one of the seven illuminatable elements of a 7-element illuminated-digit indicator unit 2. The seven lines $a_1$ to $a_7$ transmit from the output of a decoder 3 signals indicative of which elements in a particular indicator unit 2 are to be illuminated. The decoder 3 has four input lines $b_1$ to $b_4$ via which it receives four signals together representitive of a four-bit BCD (binary-coded decimal) number corresponding to one of the numerals between 0 to 9, inclusive. The input lines $b_1$ to $b_4$ are connected to respective ones of the four output lines of each of the seven counting stages $4_1$ to $4_7$ of the computing means 5 of the electronic taximeter.

In the illustrated embodiment, each counting stage $4_n$ is a BCD counting stage operative for counting received pulses and generating a 4-bit output signal corresponding to the count. Persons skilled in the art will understand that, in general, when this BCD counting scheme is employed the counting stages $4_1$ to $4_7$ will be interconnected by conventional logic circuitry for the purpose of effecting the carry operation. For example, normally a train of pulses (either time-dependent or distance-dependent) will be applied to the input of only the units counting stage $4_7$, causing the stage $4_7$ to count up from 0 to 9. When the count of stage $4_7$ thereafter reaches 0, a carry pulse is applied by conventional means to the input of the tens counting stage $4_6$, so that the stages $4_7$ and $4_6$ together register the number 10. Further pulses are applied to the input of stage $4_7$, so that this stage again counts from 0 up to 9. When the count of stage $4_7$ again reaches 0, a second carry pulse is applied to the input of the tens counting stage $4_6$, so that the stages $4_7$ and $4_6$ together register the number 20. This proceeds until these two stages together register the number 99. The receipt by stage $4_7$ of the next-following input pulse causes a carry pulse to be applied to tens stage $4_6$ and furthermore causes a carry pulse to be applied to hundreds stage $4_5$, so that these three stages together register the number 100. The application of carry pulses to the stages associated with the higher orders of ten proceeds in the same fashion. This is extremely conventional in the art, and for that reason and to avoid overcrowding the signal-transmitting lines and logic circuitry which so interconnect the counting stages as to cause them to count and carry in this way have been omitted from the drawing.

In the FIGURE, reference numeral 6 denotes a synchronizer for synchronizing the cyclical reading of the signals stored by the individual counting stages $4_1$ to $4_7$, on the one hand, and the cyclical activation of the indicator units $2_1$ to $2_7$, on the other hand. The synchronization of the cyclical operations, which is per se known, involves enabling at any given moment only a single one of the seven indicator units and, simultaneously therewith, reading the signals stored by the associated counting stage, applying those signals to the decoder 3, and from the decoder 3 to the input of the indicating means 1, and ultimately to the seven control inputs of the 7-element indicator unit in question. Although the seven indicator units $2_1$ to $2_7$ are activated cyclically, and not simultaneously, the frequency of occurrence of the complete cycle is so high as to create the visual impression of continuously and simultaneously displayed numerals. The synchronizer 6 can be the main synchronizer or clock signal generator for the computing means.

For the purpose of producing the waiting pulses there is a waiting time oscillator 7, which via a line c sends its waiting time pulses through circuitry not shown including a so-called selection circuit for selecting the faster of the two pulse-sequences — distance pulses or time pulses — to the fare computing means 5. For reasons of a high degree of exactness in fare calculation this oscillator oscillates at a relatively high frequency of say 1000 p/sec.

For carrying through the method according to the invention the time pulse sequence of the oscillator is reduced by a frequency divider 9 at a ratio of 1000:1 or 1500:1 so that a pulse sequence of 1 p.sec. or 1 p 1.5 sec. leaves frequency divider 9 via line d.

A switch $k_1$, manually activatable by a test pushbutton $T_1$ and/or automatically activated by the taximeter itself at the end of each paid-for trip, is activated to initiate a test operation. A pushbutton $T_2$ activates a second switch $k_2$. Pushbutton $T_2$ is the FREE button on the taximeter face, depressible to reset the taximeter to zero (by means omitted from the illustration for the sake of simplicity) and possibly also to activate the exterior roof light of the taxi.

When the taximeter is not in the FREE setting, switch $k_2$ is open. The switches $k_1$ and $k_2$ are connected to the inputs of a gate $G_8$. The gate $G_8$ transmits the 1000/second waiting-time pulse train generated by oscillator 7 provided that the switch $k_2$ is closed. The output of gate $G_8$ is connected to the binary frequency-divider 9 operative for converting the first pulse train (the 1000/second pulse train transmitted by gate $G_8$) into a 1/second pulse train, i.e., a pulse train having a pulse-repetition frequency of one pulse per second. It is to be understood that this frequency divider 9 may be used for other purposes as well, which may be achieved by correspondingly programming the taximeter.

When the test pushbutton $T_1$ is depressed, and/or when the test switch $k_1$ is closed by automatic means, a plurality of (non-illustrated) switches open, to disconnect those inputs normally leading into the computing means 5 during normal fare-computation and -indication operations, and further (non-illustrated) switches close, to establish the illustrated connection from the output of frequency divider 9 via line *d* to the inputs of all seven counting stages $\mathbf{4}_1$ to $\mathbf{4}_7$.

As the 1/second pulse train is applied via line *d* to all counting stages individually, each counting stage will count up from 0 to 1 to 2 to 3 up to 9 within ten seconds. During this time, the taxi driver or inspector will maintain the test pushbutton $T_1$ uninterruptedly depressed, so as to keep both switches $k_1$ and also $k_2$ closed.

During these ten seconds, all the counting stages of the computing means 5 will run one time through their entire repertory of output signal combinations, simultaneously and in unison. Accordingly, the indicator units $\mathbf{2}_1$ to $\mathbf{2}_7$ will all run once through their entire repertory of numeral display possibilities, simultaneously and in unison; i.e., the taxi driver or inspector will see displayed the numeral combinations 0000000, 1111111, 2222222, 3333333, 4444444, 5555555, 6666666, 7777777, 8888888, 9999999, in the order just indicated. If after this run-through the taxi driver or inspector continues to keep the test pushbutton $T_1$ depressed, then the run-through can be made to repeat indefinitely, if desired. In any of the counting stages, any of the indicator units, the decoder or the synchronizer is not in proper working order, then this will become apparent during the run-through, in a manner dependent upon the nature of the trouble.

For example, the numerals may not be displayed in unison i.e., during one step of the display one of the indicator units may display a numeral different from that displayed by the other indicator units. Or the run-through may proceed at a perceptibly irregular rate, or at a speed which is perceptibly too low or too high. One or more of the indicator units may change state at a rate different from that of the others. One or more of the indicator units may continue to display a particular numeral during the whole or an improperly long portion of the run-through. One or more of the indicator units may fail to display any numeral whatsoever. If the (non-illustrated) resetting circuitry is not in order, then when the test button is pushed it may happen that all the indicator units do not simultaneously display the numeral 0. With regard to the detection of trouble by perceiving the irregularity of the run-through or the improper slowness or speediness of the run-through, the use of a run-through in which the displayed numerals change at the rate of once per second or once per 1.5 seconds is particularly advantageous, because persons are in general very sensitive to this rate of advancement and can visually perceive departures from it quite well. This makes it possible, in effect, to determine with the naked eye whether the waiting-time oscillator 7 is in proper working order.

If desired, the circuit could be modified so that, when the driver or inspector presses the test pushbutton, the run-through is completed even if the pushbutton is released almost immediately. Likewise, the run-through could be performed a predetermined number of times, for example twice, in response to a brief depression of the test pushbutton.

A run-through in which the indicating means displays the seven-digit numbers 0000000, 1111111, 2222222, 3333333, 4444444, 5555555, 6666666, 7777777, 8888888, 9999999, in that order is particularly advantageous. It tends to minimze the time required for the run-through. If during any step of the run-through all displayed numerals are not the same, this is very quickly and dependably perceived by the drive or inspector. Also, a run-through performed in ascending numerical order, starting from 0000000, is particularly easy to follow visually, since the driver or inspector can "count along" in his mind.

However, other run-through schemes would be possible. The run-through could be in descending as well as ascending numerical order, and in either case need not start from 0000000, 1111111, or 9999999. Likewise, if it were for some reason desired, some other predetermined sequence of numerical combinations could be used. It would also in theory be possible to cause the individual indicators units to perform their respective run-throughs non-simultaneously or not in unison, or at different respective rates, or not concurrently but one after the other, or in an overlapping manner, etc. However, without question, the run-through scheme of the illustrated embodiment is the simplest and easiest to follow for the driver or inspector.

It will be understood that each of the elements described above, or two or more together, may also find a useful application in other types of circuits and constructions differing from the types described above.

While the invention has been illustrated and described as embodied in a particular exemplary taximeter which computes separately the components of the taxi fare dependent upon distance travelled and waiting time, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific asepcts of this invention.

What is claimed as new and desired to be protected by Letters Patent is set forth in the appended claims.

1. A method of determining whether an electronic taximeter is in order, the taximeter being of the type comprises of indicating means for displaying any of a preselected plurality of characters relating to taxi fare, computing means operative for receiving fare-determining signals and in dependence thereon computing the characters to be displayed by the indicating means, means for generating the fare-determining signals including elapsed-time pulse generating means for generating an elapsed-time pulse train of fixed pulse repetition frequency determinative of a component of fare dependent upon elapsed time, the method comprising the step of deriving from the elapsed-time pulse train and applying to the computing means a plurality of test signals causing the indicating means to provide a predetermined indication if the elapsed-time generating means, the computing means and the indicating means are all in order, the indicating means being comprised of a plurality of indicator units each capable of producing a display of any one of a plurality of different characters, the step of deriving from the elapsed-time pulse train and applying to the computing means the plurality of test signals comprising deriving from the elapsed-time pulse train and applying to the computing means a plurality of test signals causing the indicator units to simultaneously and in unison display the same predetermined sequence of characters.

2. The method of claim 1, the step of deriving from the elapsed-time pulse train and applying to the computing means the plurality of test signals comprising frequency dividing the elapsed-time pulse train to produce at least one train of test signals which when applied to the computing means causes the indicating means to display successive groups of characters at a rate low enough to be followed by the human eye if the elapsed-time pulse generating means, the computing means and the indicating means are all in order.

3. The method of claim 2, the pulse repetition frequency of the train of test signals being of the order of magnitude of one per second.

4. The method of claim 1, the deriving of the test signals comprising frequency dividing the elapsed-time pulse train to produce at least one train of test signals having a pulse repetition frequency on the order of about one per second.

5. In an electronic taximeter of the type comprised of indicating means for displaying any of a preselected plurality of characters relating to taxi fare, computing means operative for receiving fare-determining signals and in dependence thereon computing the characters to be displayed by the indicating means, and means for generating te fare-determining signals including elapsed-time pulse generating means for generating an elapsed-time pulse train of fixed pulse repetition frequency determinative of a component of fare dependent upon elapsed time, the improvement comprising an arrangement for determining whether the elapsed-time pulse generating means, the computing means and the indicating means are in order, said arrangement comprising selectively activatable means operative for deriving from the elapsed-time pulse train and for applying to the computing means a plurality of test signals causing the indicating means to provide a predetermined indication if the elapsed-time pulse generating means, the computing means and the indicating means are all in order, the means for deriving and applying the test signals comprising means for deriving from the elapsed-time pulse train by frequency division a plurality of test signals having a pulse repetition frequency on the order of magnitude of one per second which when applied to the computing means causes the indicating means to display a predetermined sequence of groups of identical characters if the elapsed-time pulse generating means, the computing means and the indicating means are all in order.

6. In an electronic taximeter of the type comprises of indicating means for displaying any of a preselected plurality of characters relating to taxi fare, computing means operative for receiving fare-determining signals and in dependence thereon computing the characters to be displayed by the indicating means, and means for generating the fare-determining signals including elapsed-time pulse generating means for generating an elapsed-time pulse train of fixed pulse repetition frequency determinative of a component of fare dependent upon elapsed time, the improvement comprising an arrangememnt for determining whether the elapsed-time pulse generating means, the computing means and the indicating means are in order, said arrangement comprising selectively activatable means operative for deriving from the elapsed-time pulse train and for appyling to the computing means a plurality of test signals causing the indicating means to provide a predetermined indication if the elapsed-time pulse generating means, the computing means and the indicating are all in order, the means deriving and applying the test signals comprising means for deriving from the elapsed-time pulse train a plurality of test signals which when applied to the computing means causes the indicating means to display at a rate on the order of magnitude of one per second a predetermined sequence of groups of identical characters if the elapsed-time pulse generating means, the computing means and the indicating means are all in order.

7. The taximeter defined in claim 6, the arrangement further including manually operable activating means for activating the testing arrangement.

8. The taximeter defined in claim 6, the arrangement further including means for automatically activating the testing arrangement upon the completion of a fare computation at the end of a paid passenger trip.

* * * * *